United States Patent [19]

Hartemann

[11] 4,034,288

[45] July 5, 1977

[54] SYSTEM FOR MEASURING THE FREQUENCY OF AN ELECTRICAL SIGNAL

[75] Inventor: Pierre Hartemann, Paris, France

[73] Assignee: Thomson-CSF, Paris, France

[22] Filed: June 13, 1975

[21] Appl. No.: 586,750

[30] Foreign Application Priority Data

June 18, 1974 France .............................. 74.21123

[52] U.S. Cl. .................................. 324/80; 333/72
[51] Int. Cl.² ........................................ G01R 23/00
[58] Field of Search ................. 324/80; 333/72, 30

[56] References Cited

UNITED STATES PATENTS

| 3,697,899 | 10/1972 | Dias | 333/72 |
| 3,727,718 | 4/1973 | Whitehouse | 324/80 |

Primary Examiner—Rudolph V. Rolinec
Assistant Examiner—Michael J. Tokar
Attorney, Agent, or Firm—Cushman, Darby & Cushman

[57] ABSTRACT

The present invention relates to system for measuring the frequency of an electrical signal. The device in accordance with the invention comprises, deposited upon a piezo-electric substrate a transducer array in the form of interdigital comb structures whose teeth are in the form of a circular arc and which are capable of emitting surface elastic waves at the surface of the substrate, and a series of pick-ups elements of substantially point type, arranged to selectively receive said surface elastic waves.

11 Claims, 3 Drawing Figures

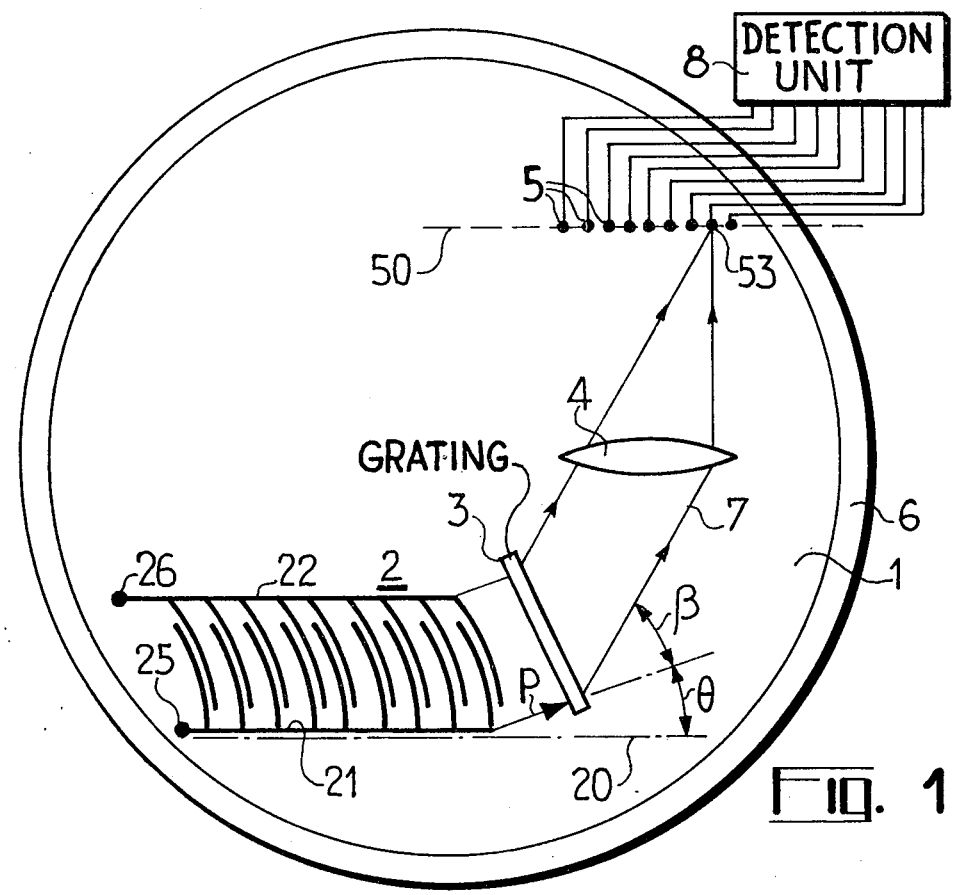
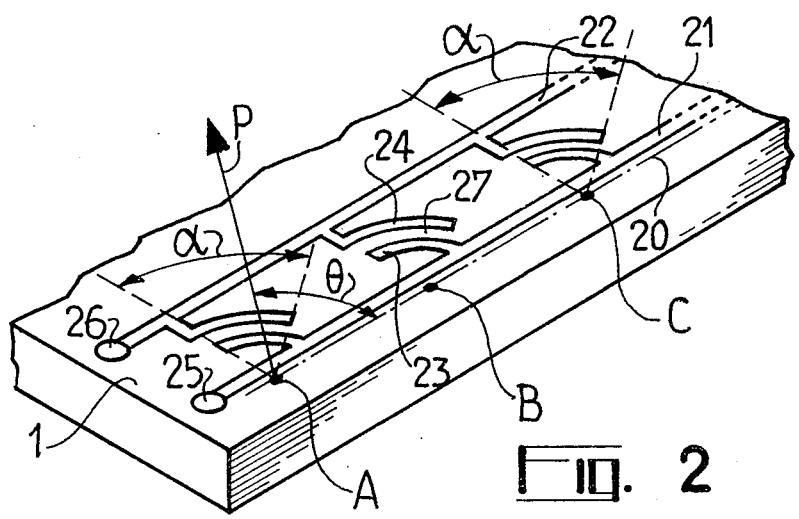

SYSTEM FOR MEASURING THE FREQUENCY OF AN ELECTRICAL SIGNAL

The present invention relates to the measurement of the frequency of an electrical signal with the help of surface elastic waves. Measurement devices of this kind are employed in particular in Doppler-type radar systems in which detection is achieved by evaluating the frequency variation between the launched wave and the wave returned back from the target to the receiver.

The measurement of this variation in this kind of radar, is conventionally performed with the help of electronic frequency filter devices utilising numerous components and therefore bulky and expensive to manufacture.

One object of the present invention is to contrive simple means of measuring frequency with the help of a simple and compact device, utilising elastic waves propagating at the surface of a substrate, more particularly by converting the frequency variation which is to be measured into a modification of the path followed by the elastic waves.

In accordance with the present invention there is provided a system for measuring the frequency of an electrical signal, said system comprising: a substrate of piezo electric material having a face for propagating vibratory energy in the form of surface elastic waves, and a transducer array of radiator elements positioned on said face for launching in response to said electrical signal a narrow beam of said vibratory energy; said narrow beam having in said face N distinct transmission paths respectively corresponding to N distinct values of said frequency; said system further comprising a set of N elementary detection means respectively located on said face along said N distinct transmission paths for supplying an indication relative to any one of said N distinct values; N being an integer at least equal to two.

For a better understanding of the present invention and to show how the same may be carried into effect reference will be made to the ensuing description and the related drawings among which:

FIG. 1 illustrates an embodiment of the system in accordance with the invention;

FIG. 2 illustrates an embodiment of an electromechanical transducer utilised in the system in accordance with the invention;

In these various figures, similar references relate to similar elements.

Figure 3:
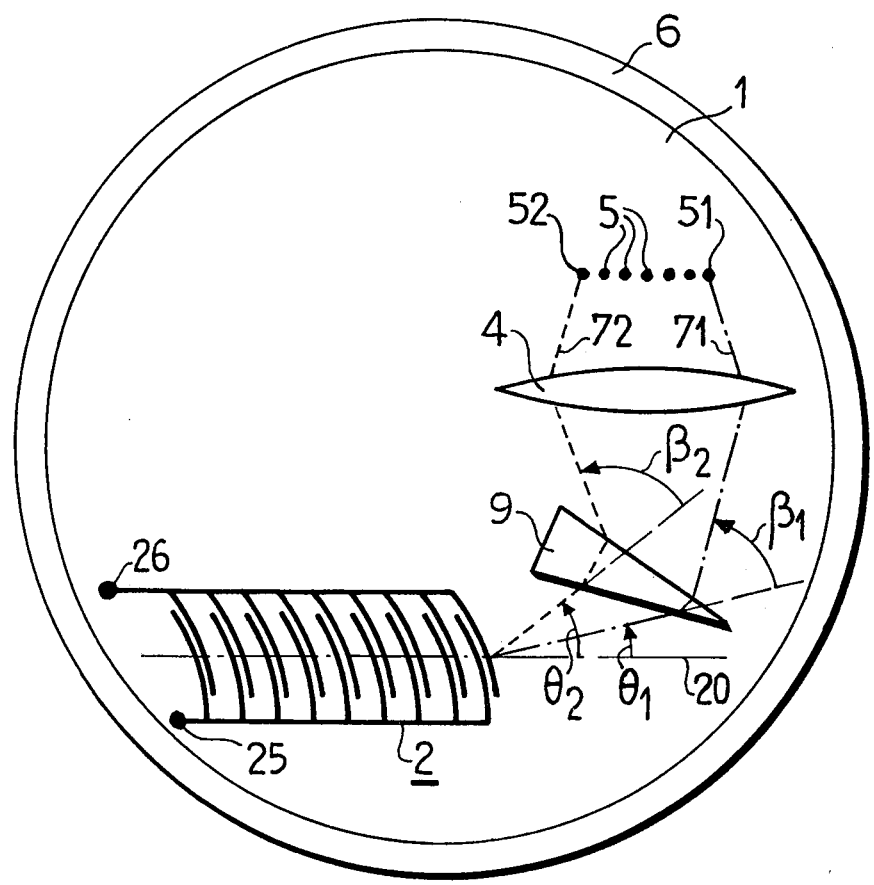
FIG. 3 is a variant embodiment of the system shown in FIG. 1.

In FIG. 1, a substrate 1 made of a preferably isotropic piezo-electric material, such as a ceramic, has been shown, upon which there have been deposited a transducer array 2, a diffraction grating 3, a lens 4 and a series of wave detection means 5. The substrate 1 shown here takes the form of a disc; it is bordered peripherally by a material 6 which absorbs the elastic waves and is designed to prevent parasitic reflection of said waves at the edges of the substrate.

The transducer array 2, an embodiment of which has been shown in FIG. 2, has the function of emitting a narrow beam of surface elastic waves in a direction (marked P) which varies with the frequency of the electrical signal applied to it. To this end, it is constituted by a pair of interdigital comb structures 21 and 22. The teeth 23 and 24 of the two combs are arranged in the form of concentric arcs whose respective geometric centers are indicated by the points A, B, C, etc. which are aligned and preferably equidistantly spaced, upon a longitudinal axis 20 of the transducer array. Between two homologous teeth 23 and 24 of the two combs 21 and 22, a curved gap or interval 27 is left, and this is the source of an inducing electric field when a voltage is applied across the terminals 25 and 26. The vibratory energy emitted under these circumstances has a substantially circular wave front within an angle $\alpha$ delimited by the extremities of the interval 27, and thus behaves like radiator elements whose respective phase centers are the points A, B, C, etc.

It is well known that an array of point sources such as A, B, and C, produces in a given direction, a radiation the intensity of which is a function of its wavelength. In other words, the direction of the peak emission intensity P of the radiated beam which makes an angle $\Theta$ with the axis 20 within the angle $\alpha$ varies, in accordance with the frequency of the electrical signal applied to the terminals 25 and 26.

The diffraction grating 3 is designed to amplify the deviation $\Theta$ in relation to the axis 20.

In this figure, it is constituted by a phase grating formed by an array of metal layer deposits, for example gold, of quasi-point type, equidistantly spaced, deposits of this sort producing a variation in the velocity of propagation of the elastic waves and more precisely a diminution in said velocity in the case of a gold deposit upon a ceramic. Those skilled in the art will be aware that the wave is deflected by a grating of this kind through an angle $\beta$ proportional to the wave-length of the elastic wave; it is thus possible to produce a deflection $\Theta + \beta$ which is a function of the input signal frequency.

The function of the lens 4, as those skilled in the art will be aware, is to concentrate the elastic wave at a point located upon its focal line 50, the position of which point on said line depends upon the deflection $\Theta + \beta$ and consequently upon the frequency of the input signal.

A lens of this kind can also be produced by the deposition of a layer of a conductive material, which results in a variation in the velocity of propagation of the elastic waves: for example a gold deposit.

For purposes of clarity, in FIG. 1 the trajectory, marked 7, followed by the effective part of the surface elastic waves emitted by the transducer 2, has been shown; the beam 7 is emitted in the direction P, that is to say at an angle $\Theta$ in relation to the axis 20, since it is diffracted by the grating 3 by an angle $\beta$ in relation to the direction P, and it is ultimately concentrated by the lens 4 at a point 53 on the axis 50, this being a theoretical point which in reality has a certain finite size.

Finally, the wave detection means 5 are arranged on the focal line 50. Their pitch and number are determined by the desired accuracy of the application of this kind of system to a Doppler radar system, the frequency range received may extend over 100 Khz; if it is desired to achieve a resolving power of the order of 1 Khz, then 100 pick-ups 5 will be arranged at a pitch of around 150 microns.

The pick-ups 5 can be constituted by potential sensors, each constituted by a conductive point resting on the substrate 1 and electrically connected to a detector device schematically illustrated in the FIG. 1 by a block 8. The conductive point transmits to the block 8 the variation in electric potential at the surface, which variation accompanies an elastic wave propagating at the surface of a piezo-electric substrate.

Another embodiment of each of the pick-ups 5 is the field-effect transistor and, more particularly, the MOS transistor, the channel of which is given a geometry such that the surface it occupies on the substrate 1 is small in area although of adequate sensitivity; a spiral geometry for example, inscribed within a square of 50 to 100 microns in side length, if we stay with the numerical example referred to earlier.

FIG. 3 illustrates a variant embodiment of the device in accordance with the invention, in which the diffraction grating 3 of FIG. 1 is replaced by a prism 9 also having the function of amplifying the deviation Θ in relation to the axis 20. The prism 9 will preferably be designed in the same way as the lens 4, that is to say will take the form of a metal deposit of triangular shape.

Moreover, in this figure by way of clarification, the axes (71 and 72) of the trajectories followed by the elastic waves at the surface of the substrate 1 for the extreme frequencies of the signal applied to the transducer 2, have been shown. Thus, elastic waves are emitted along an axis 71 in the first case, the axis 71 making an angle $\Theta_1$ with the axis 20, and accordingly an overall angle of $\Theta_1 + \beta_1$ after passing through the prism 9 and terminating at a pick-up 51; elastic waves are emitted along an axis 72 in the second case, which axis in a similar fashion makes an angle of $\Theta_2 > \Theta_1$ with the axis 20 and therefore an angle of $\Theta_2 + \beta_2$ after passing the prism 9 and terminating at a pick-up 52, the other pick-ups 5 being arranged between 51 and 52.

What I claim is:

1. A system for measuring the frequency of an electrical signal, said system comprising: a substrate of piezo-electric material having a face for propagating vibratory energy in the form of surface elastic waves, and a transducer array of radiator elements positioned on said face for launching in response to said electrical signal a frequency steerable narrow beam of said vibratory energy; said narrow beam having in said face N distinctly orientated transmission paths respectively corresponding to N distinct values of said frequency; said system further comprising a set of N elementary detection means respectively located on said face along said N distinct transmission paths for supplying an indication relative to any one of said N distinct values; N being an integer at least equal to two.

2. A system as claimed in claim 1, further comprising between said transducer array and said elementary detection means, means located on said face for concentrating said narrow beam at the respective detection zones of said elementary detection means.

3. A system as claimed in claim 1, wherein said transducer array is constituted by electrodes of interdigital comb type; the teeth of said electrodes delimiting an assembly of discrete radiating gaps emitting elastic waves; the teeth adjacent to an arbitrary radiator element in said assembly being in the form of concentric circular arcs; the geometric center of said concentric circular arcs being the emission phase center of said radiator element.

4. A system as claimed in claim 3, wherein the geometric centers of said radiator elements are equidistantly spaced.

5. A system as claimed in claim 2 wherein said concentrating means are constituted by a thin metal layer deposited upon the surface of said substrate; said layer building up a lens.

6. A system as claimed in claim 1, further comprising intermediate means for amplifying the angle of deviation of said narrow beam.

7. A system for measuring the frequency of an electrical signal having a face for propagating vibratory energy in the form of surface elastic waves, and a transducer array of radiator elements positioned on said face for launching in response to said electrical signal a narrow beam of said vibratory energy; said narrow beam having in said face N distinct transmission paths respectively corresponding to N distinct values of said frequency; said system further comprising a set of N elementary detection means respectively located on said face along said N distinct transmission paths for supplying an indication relative to any one of said N distinct values; N being an integer at least equal to two; said system further comprising intermediate means for amplifying the angle of deviation of said narrow beam, and said intermediate means being constituted by a phase grating diffracting the surface elastic waves received from said transducer array.

8. A system for measuring the frequency of an electrical signal, said system comprising: a substrate of piezo-electric material having a face for propagating vibratory energy in the form of surface elastic waves, and a transducer array of radiator elements positioned on said face for launching in response to said electrical signal a narrow beam of said vibratory energy; said narrow beam having in said face N distinct transmission paths respectively corresponding to N distinct values of said frequency; said system further comprising a set of N elementary detection means respectively located on said face along said N distinct transmission paths for supplying an indication relative to any one of said N distinct values; N being an integer at least equal to two; said system further comprising intermediate means for amplifying the angle of deviation of said narrow beam, and said intermediate means being constituted by a thin metal layer deposited upon the surface of said substrate; the outline of said layer being in the form of a triangle.

9. A system for measuring the frequency of an electrical signal, said system comprising: a substrate of piezo-electric material having a face for propagating vibratory energy in the form of surface elastic waves, and a transducer array of radiator elements positioned on said face for launching in response to said electrical signal a narrow beam of said vibratory energy; said narrow beam having in said face N distinct transmission paths respectively corresponding to N distinct values of said frequency; said system further comprising a set of N elementary detection means respectively located on said face along said N distinct transmission paths for supplying an indication relative to any one of said N distinct values; N being an integer at least equal to two; said elementary detection means being each consitituted by a field effect semiconductor structure; said structure comprising a channel in the form of a spiral.

10. A system for measuring the frequency of an electrical signal, said system comprising: a substrate of piezo-electric material having a face for propagating vibratory energy in the form of surface elastic waves, and a transducer array of radiator elements positioned on said face for launching in response to said electrical signal a narrow beam of said vibratory energy; said narrow beam having in said face N distinct transmission paths respectively corresponding to N distinct values of said frequency; said system further comprising a set of N elementary detection means respectively located on said face along said N distinct transmission paths for supplying an indication relative to any one of said N distinct values; N being an integer at least equal to two; said elementary detection means being each constituted by an electrically conductive probe connected to a potential-measuring device.

11. A system as claimed in claim 1, wherein said substrate is constituted by an isotropic ceramic material.

* * * * *